United States Patent
Cheong et al.

(10) Patent No.: US 7,094,694 B2
(45) Date of Patent: Aug. 22, 2006

(54) SEMICONDUCTOR DEVICE HAVING MOS VARACTOR AND METHODS FOR FABRICATING THE SAME

(75) Inventors: Kong-Soo Cheong, Seoul (KR); Ki-Seog Youn, Suwon-si (KR); Kyung-Soo Kim, Sungnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/023,623

(22) Filed: Dec. 29, 2004

(65) Prior Publication Data

US 2005/0142779 A1    Jun. 30, 2005

(30) Foreign Application Priority Data

Dec. 30, 2003    (KR) .................... 10-2003-0100232

(51) Int. Cl.
*H01L 21/44*    (2006.01)
(52) U.S. Cl. ...................... 438/682; 438/184
(58) Field of Classification Search ................ 438/184, 438/682

See application file for complete search history.

(56) References Cited

U.S. PATENT DOCUMENTS

| 5,589,423 A | 12/1996 | White et al. |
| 5,883,010 A | 3/1999 | Merrill et al. |
| 6,338,993 B1 | 1/2002 | Lien |

FOREIGN PATENT DOCUMENTS

JP        11097649        4/1999

*Primary Examiner*—W. David Coleman
*Assistant Examiner*—Su C. Kim
(74) *Attorney, Agent, or Firm*—Valentine Francos & Whitt, PLLC

(57) ABSTRACT

In a method for manufacturing a semiconductor device, a gate electrode is formed in a first region. A silicide blocking layer is patterned such that a first gate spacer is formed on sidewalls of the gate electrode, and a silicide blocking layer pattern is formed in a second region. A lightly doped source/drain region is formed on surface of the first region. A second gate spacer is formed on sidewalls of the first gate spacer. A heavily doped source/drain region is formed on the surface of the first region. A silicide layer is formed on the gate electrode and the heavily doped source/drain region in the first region.

20 Claims, 10 Drawing Sheets

SEMICONDUCTOR DEVICE HAVING MOS VARACTOR AND METHODS FOR FABRICATING THE SAME

BACKGROUND OF THE INVENTION

1. Field of the Invention

The present invention generally relates to a method of manufacturing a semiconductor device. More particularly, the present invention generally relates to a method of manufacturing a semiconductor device in which a silicide blocking layer and a spacer are simultaneously formed prior to an impurity implantation.

A claim of priority is made to Korean Patent Application No. 2003-100232 filed on Dec. 30, 2003, the contents of which are herein incorporated by reference in their entirety.

2. Description of the Related Art

As semiconductor devices have become more integrated, the size of each unit device has gradually reduced. Thus, the interval between each unit devices has also gradually reduced. The reduction in both size and interval of each unit device has improved the manufacturing yield of the semiconductor devices, but has also caused manufacturing problems.

For example, a higher degree of integration leads to the reduction in a channel length in a metal-oxide silicon transistor, and the reduction causes a short channel effect such as a punch through and a threshold voltage reduction. To improve the short channel effect, a low temperature heat treatment process has been used, which prevents lateral diffusion of implanted impurities in a lightly doped source/drain region.

The higher degree of integration also leads to an increase in sheet resistance by conductive structures such as a gate electrode and a source/drain region, which in turn, reduces the operational speed of the semiconductor devices. Conventionally, a silicide layer has been formed on the conductive structures to reduce the sheet resistance.

However, the low temperature heat treatment process is incompatible with the silicidation process. Conventionally, if a substrate contains both a resistance device without a silicide layer and a transistor with a silicide layer, the transistor is usually formed prior to the formation of the resistance device, and the resistance device generally operate in an analogue mode. The transistor is formed on a first region, and the first region is formed on a source/drain region. The resistance device is formed on a second region, and a silicide blocking layer is formed on the second region. The silicide layer is formed on the conductive structures in the first region, and formed only on a gate structure and source/drain structure of the transistor in the second region.

In the above described process, the silicide blocking layer is generally formed at a high temperature to enhance the diffusion of the impurities into the source/drain region. In other words, the silicidation process is generally performed at a high temperature.

To solve the above described problem, for example, U.S. Pat. No. 5,883,010 discloses using spacers instead of a silicide blocking layer to protect a portion of the substrate not having the silicide layer during a silicidation process. A spacer oxide layer pattern is formed at the same time when the gate spacer is formed to prevent the silicide layer from being coated on the portion of the substrate without the silicide layer.

SUMMARY OF THE INVENTION

Accordingly, the present invention provides a method for manufacturing a semiconductor device in which a silicide blocking layer and a spacer are simultaneously formed prior to an impurity implantation.

According to an aspect of the present invention for manufacturing the semiconductor device by forming at a gate electrode in a first region of a semiconductor substrate, forming a silicide blocking layer on the substrate and the gate electrode, partially removing the silicide blocking layer to form a first gate spacer on sidewalls of the gate electrode on the first region and a silicide blocking layer pattern on a second region, implanting dopants lightly into the substrate using the silicide blocking layer, the gate electrode, and the first gate spacer as a first implantation mask to form a lightly doped source/drain region on the first region, forming a second gate spacer on sidewalls of the first gate spacer, implanting dopants heavily into the substrate using the silicidate blocking layer, the gate electrode, the first gate spacer, and the second implantation gate spacer as a second implantation mask to form a heavily doped source/drain region on the first region, and forming a silicide layer on the gate electrode and the heavily doped source/drain region in the first region.

The present invention also discloses a method for manufacturing a semiconductor device by forming a gate electrode in a transistor region of a semiconductor substrate, the substrate being divided into the transistor region and a resistor region forming a silicide blocking layer on the substrate and the gate electrode, partially removing the silicide blocking layer such that a first gate spacer is formed on sidewalls of the gate electrode on the transistor region and a silicide blocking layer formed on the resistor region, implanting dopants lightly into the surface of the substrate using the silicide blocking layer, the gate electrode, and the first gate spacer as a first implantation mask to form a lightly doped source/drain region on the surface of the transistor region, forming a second gate spacer on sidewalls of the first gate spacer, implanting dopants heavily into the surface of the substrate using the silicide blocking layer, the gate electrode, the first gate spacer, and the second gate spacer as a second implantation mask to form a heavily doped source/drain region on the surface of the transistor region, and forming a silicide layer on the gate electrode and the heavily doped source/drain region in the transistor region.

The present invention further discloses a method for manufacturing a semiconductor device by forming a gate electrode in a transistor region of a semiconductor substrate, the substrate being divided into the transistor region and a resistor region, forming a first gate spacer on sidewalls of the gate electrode, implanting dopants lightly into the surface of the substrate using the gate electrode and the first gate spacer as a first implantation mask to form a lightly doped source/drain region, forming a silicide blocking layer on the substrate and the lightly doped source/drain region, partially removing the silicidation blocking layer such that a second gate spacer is formed on sidewalls of the first gate spacer in the transistor region and a silicide blocking layer pattern is formed in the resistor region, implanting dopants heavily into the surface of the substrate using the silicide blocking layer, the gate electrode, the first gate spacer, and the second implantation gate spacer as a second mask to form a heavily doped source/drain region on the surface of the transistor region, and forming a silicide layer on the gate electrode and the heavily doped source/drain region in the transistor region.

BRIEF DESCRIPTION OF THE DRAWINGS

The above aspects of the present invention will become apparent by reference to the following detailed description in conjunction with the accompanying drawings, in which:

FIGS. 2A through 2I are cross sectional views illustrating process steps for a method of manufacturing a semiconductor according another embodiment of the present invention.

DESCRIPTION OF THE EMBODIMENTS

The present invention now will be described in detail hereinafter with reference to the accompanying drawings in which embodiments of the present invention are shown.

It will be understood that when an element such as layer, region or substrate is referred to as being "on" or "onto" another element, the element is either directly on the other element or intervening elements may also be present.

Embodiment 1

FIGS. 1A through 1J are cross sectional views illustrating process steps for a method of manufacturing a semiconductor according to a first exemplary embodiment of the present invention.

Figure 1A:
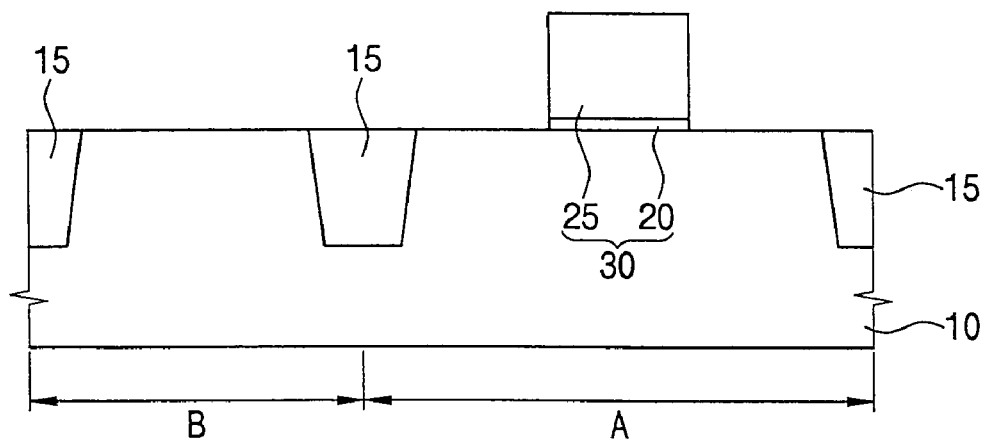
FIGS. 1A through 1J are cross sectional views illustrating process steps for a method of manufacturing a semiconductor according to an embodiment of the present invention.

Referring to FIG. 1A, a device isolation layer 15 is formed in a semiconductor substrate 10; substrate 10 is divided into a transistor region A and a resistor region B. Then, a gate insulating layer (not shown) and a polysilicon layer (not shown) are sequentially formed on substrate 10. The gate insulating layer and the polysilicon layer are partially removed from substrate 10 to form a gate insulating layer pattern 20 and a polysilicon layer pattern 25, respectively. Accordingly, at least one gate electrode 30 having gate insulating layer pattern 20 and polysilicon layer pattern 25 is formed in the transistor region of substrate 10.

Figure 1B:
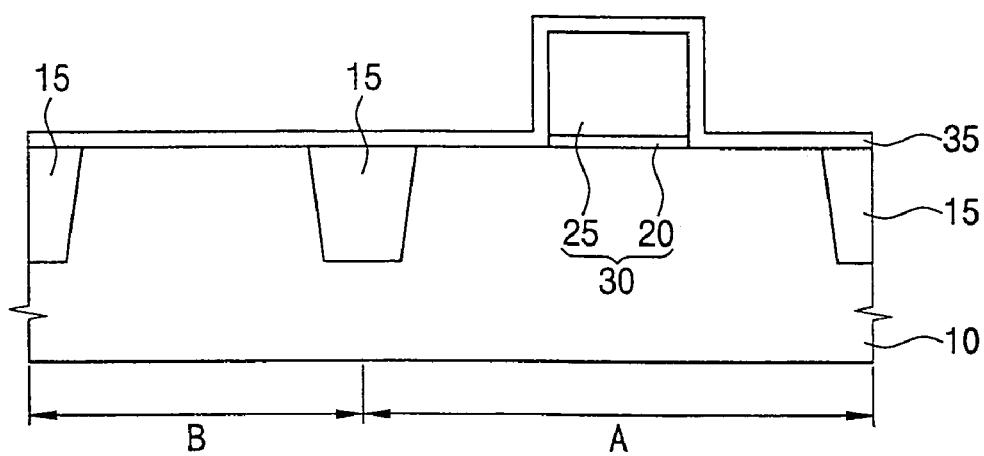

Referring to FIG. 1B, a silicide blocking layer 35 is formed on substrate 10 and gate electrode 30. Silicide blocking layer 35 is preferably a silicon nitride layer, silicon oxide layer, or a composition layer thereof, and has a thickness of about 1 Å to about 1500 Å.

Figure 1C:
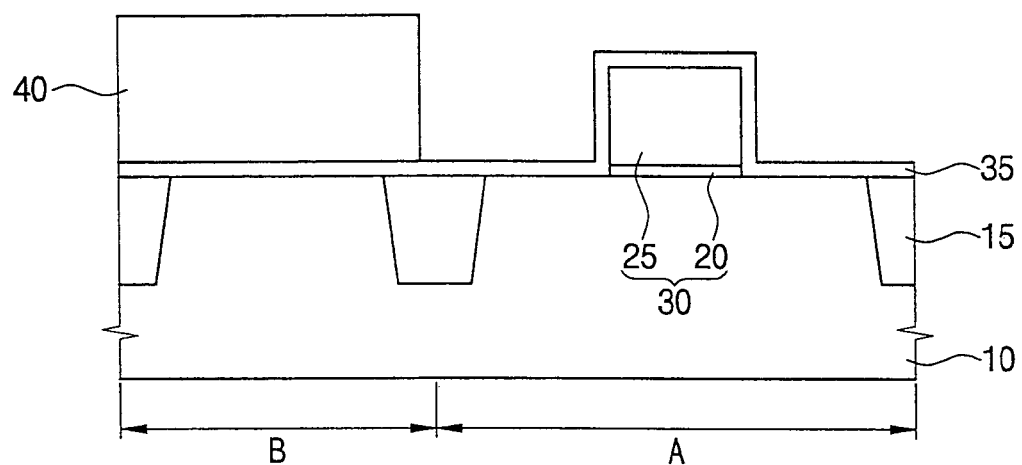

Referring to FIG. 1C, a photoresist film (not shown) is coated on silicide blocking layer 35, and is partially removed by an exposing and developing processes to form a photoresist pattern 40.

Figure 1D:
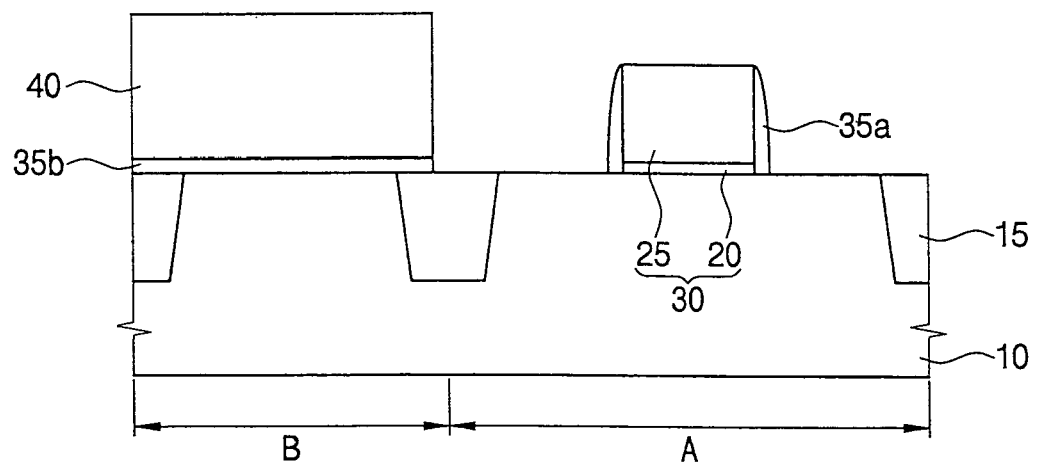

Referring to FIG. 1D, silicide blocking layer 35 is partially etched away using photoresist pattern 40 as an etching mask, and as a result, an offset spacer 35a is formed on sidewalls of gate electrode 30 on transistor region A, and a silicide blocking layer pattern 35b is formed on resistor region B.

Figure 1E:
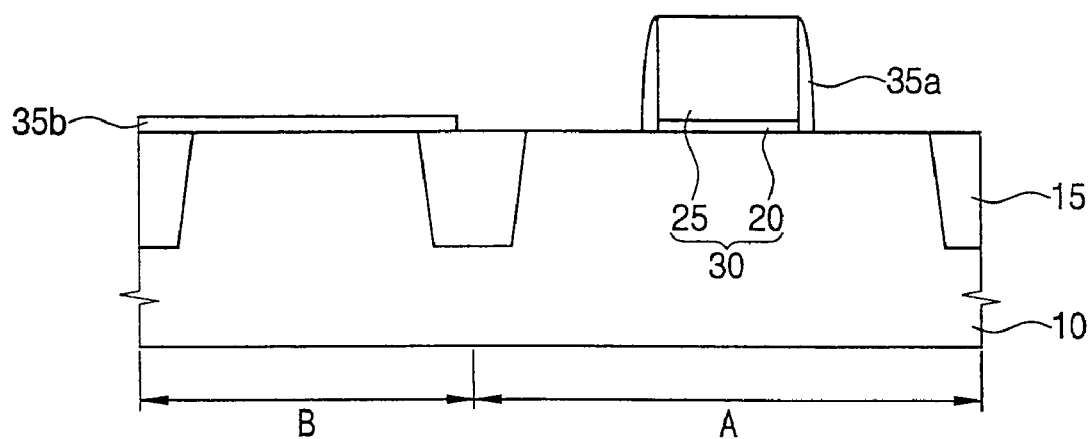

Referring to FIG. 1E, photoresist pattern 40 on resistor region B is removed. Offset spacer 35a remains on the sidewalls of gate electrode 30, thus improving the short channel effect by extending the channel length of gate electrode 30 prior to the formation of a lightly doped source/drain region (refer to FIG. 1F). In addition, silicide blocking layer pattern 35b remains in resistor region B to prevent a silicide layer from getting coated on resistor region B in a later process step.

Figure 1F:
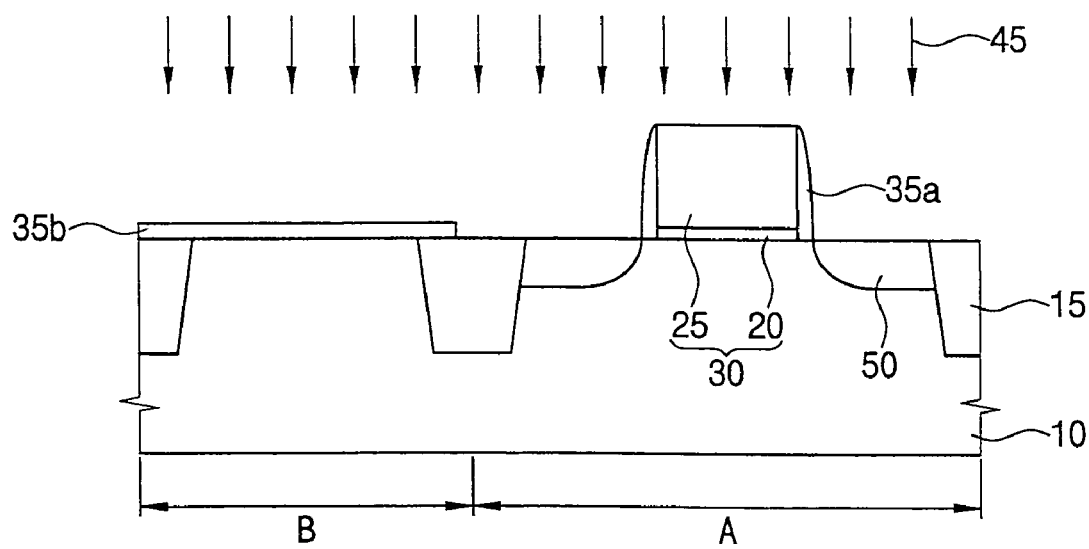

Referring to FIG. 1F, first dopants 45 are lightly implanted into substrate 10 using silicide blocking layer pattern 35b, gate electrode 30, and offset spacer 35a as an implant mask to form a lightly doped source/drain region 50.

Figure 1G:
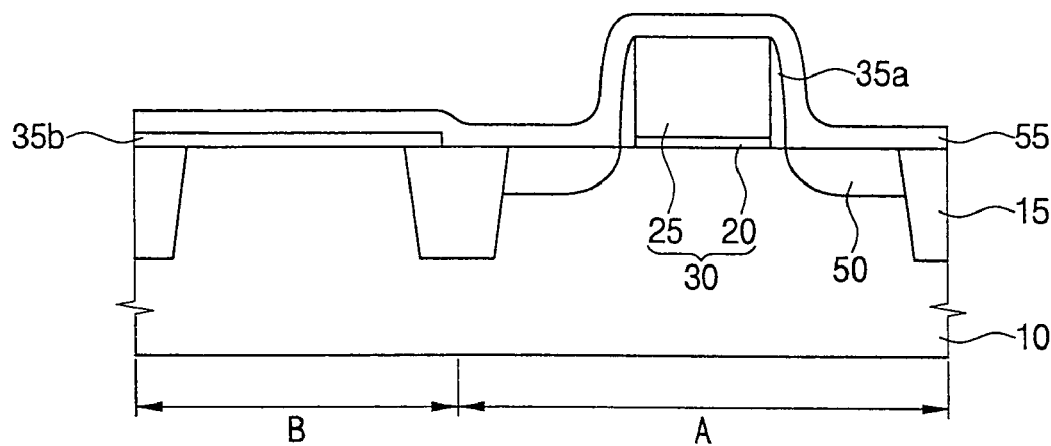

Referring to FIG. 1G, an insulating layer 55 is formed on the surface of substrate 10 including lightly doped source/drain region 50.

Figure 1H:
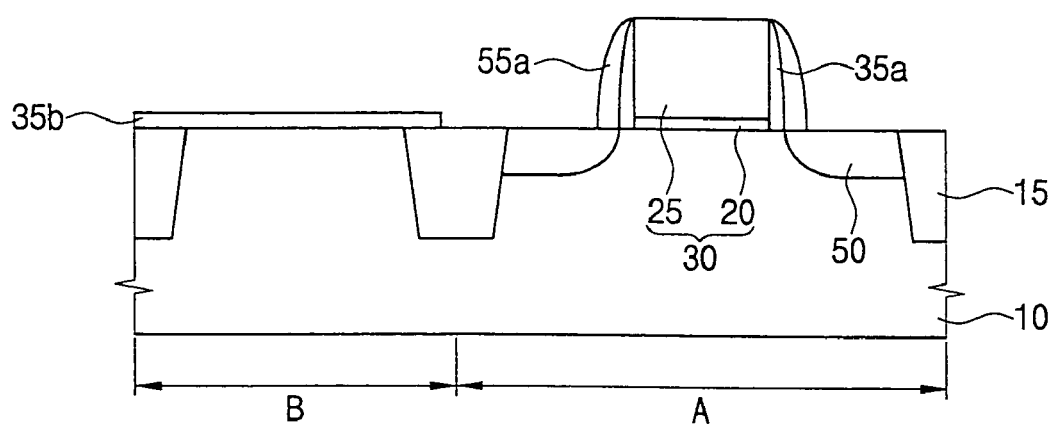

Referring to FIG. 1H, insulation layer 55 is partially removed by, for example, an etch-back process, to form a gate spacer 55a on the sidewalls of the offset spacer 35a.

Figure 1I:
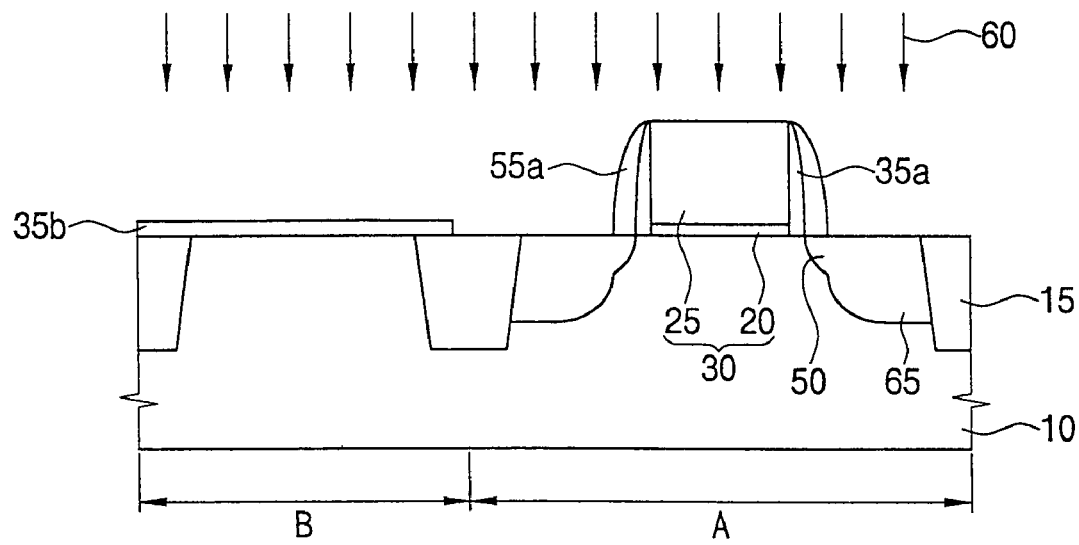

Referring to FIG. 1I, second dopants 60 are heavily implanted into substrate 10 using silicide blocking layer pattern 35b, gate electrode 30, offset spacer 35a, and gate spacer 55a as another implant mask, to form a heavily doped source/drain region 65.

Figure 1J:
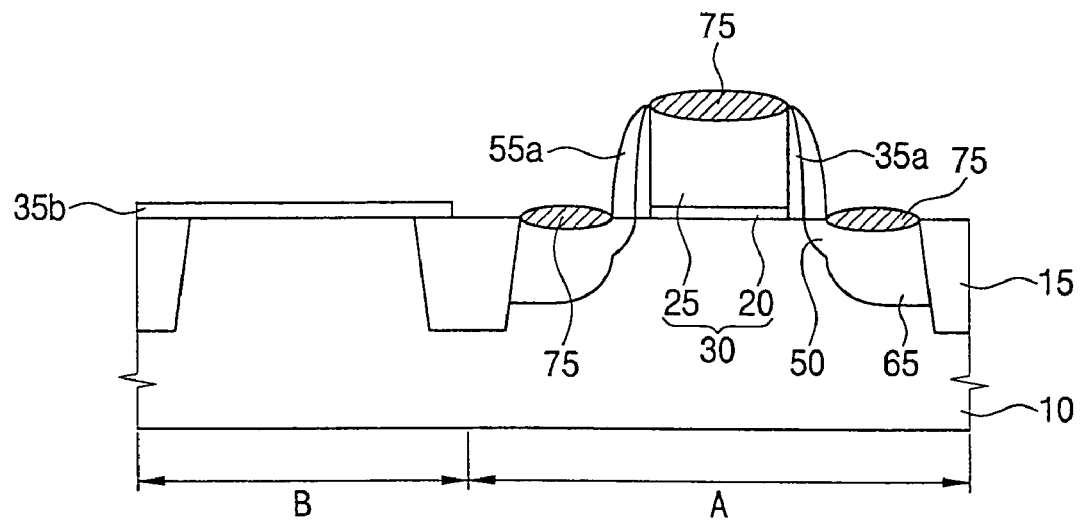

Referring to FIG. 1J, a silicide layer 75 is formed on gate electrode 30 and heavily doped source/drain region 65. In the present embodiment, a metal layer (not shown), preferably of titanium (Ti), cobalt (Co), iron (Fe), and nickel (Ni), having a high melting point is formed on substrate 10 including heavily doped source/drain region 65. A heat treatment is performed on the metal layer to generate a silicidation reaction between the metal layer and silicon on the surface of substrate 10 and heavily doped source/drain region 65. The portion of the metal layer remaining after the silicidation reaction is removed. Accordingly, silicide layer 75 is formed on gate electrode 30 and heavily doped source/drain region 65.

Embodiment 2

FIGS. 2A through 2I are cross sectional views illustrating process steps for a method of manufacturing a semiconductor according to another embodiment of the present invention.

In FIGS. 2A through 2I, the same reference numerals denote the same or like elements as those shown in FIGS. 1A through 1J, and thus the detailed descriptions for the same elements will be omitted to avoid redundancy.

Figure 2A:
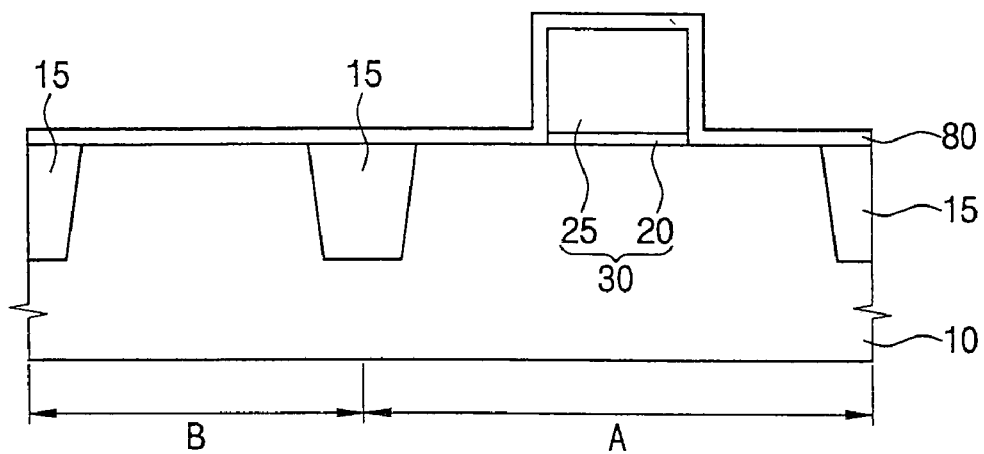

Referring to FIG. 2A, a device isolation layer 15 is formed in a semiconductor substrate 10; substrate 10 is divided into a transistor region A and a resistor region B. Then, a gate insulating layer (not shown) and a polysilicon layer (not shown) are sequentially formed on substrate 10. The gate insulating layer and the polysilicon layer are partially removed from substrate 10 to form a gate insulating layer pattern 20 and a polysilicion layer pattern 25, respectively. Accordingly, at least one gate electrode having gate insulating layer pattern 20 and polysilicion layer pattern 25 is formed on transistor region A. Then an insulating layer 80 is formed on semiconductor substrate 10.

Figure 2B:
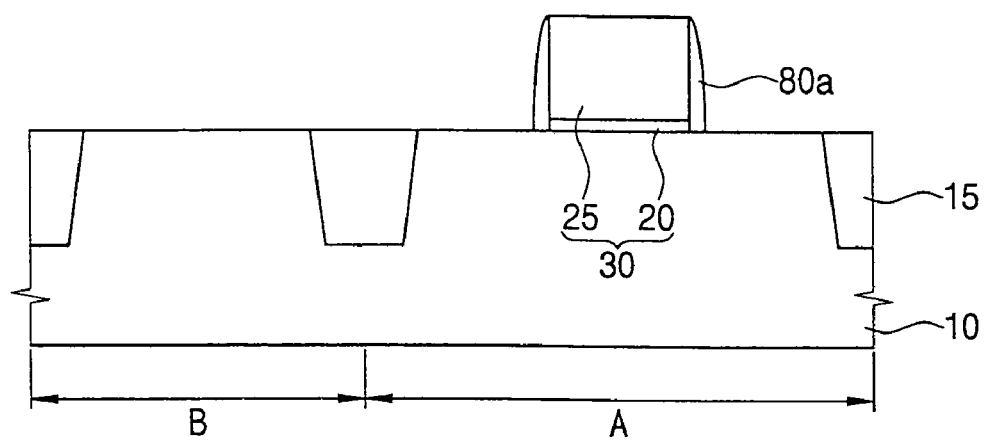

Referring to FIG. 2B, insulating layer 80 is partially removed by, for example, an etch-back process, so that an offset spacer 80a is formed on sidewalls of gate electrode 30. The offset spacer 80a on the sidewalls of gate electrode 30 improves the short channel effect by extending the channel length of gate electrode 30 prior to the formation of a lightly doped source/drain region (refer to FIG. 1F).

Figure 2C:
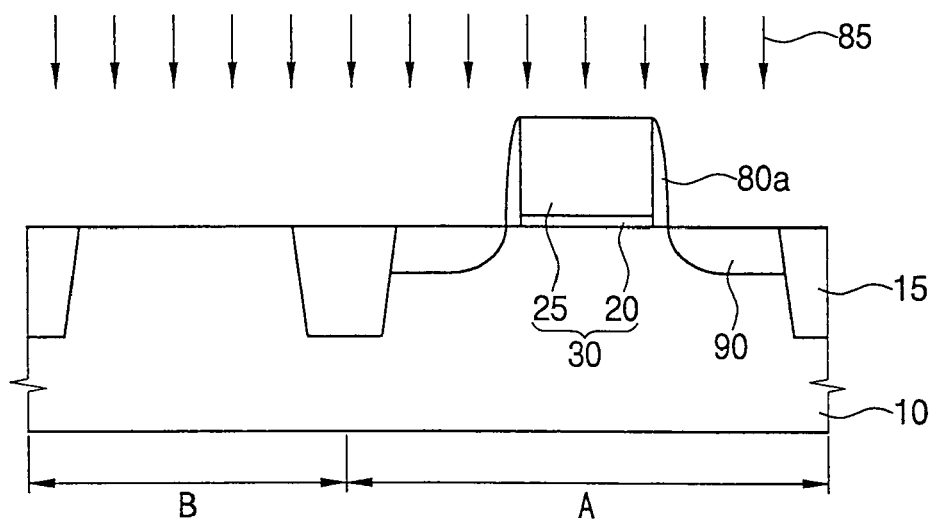

Referring to FIG. 2C, first dopants 85 are lightly implanted into substrate 10 using gate electrode 30 and offset spacer 80a as an implant mask to form a lightly doped source/drain region 90. Although not shown in the drawings, a photoresist pattern is formed in resist region B, and removed after the first dopants are implanted.

Figure 2D:
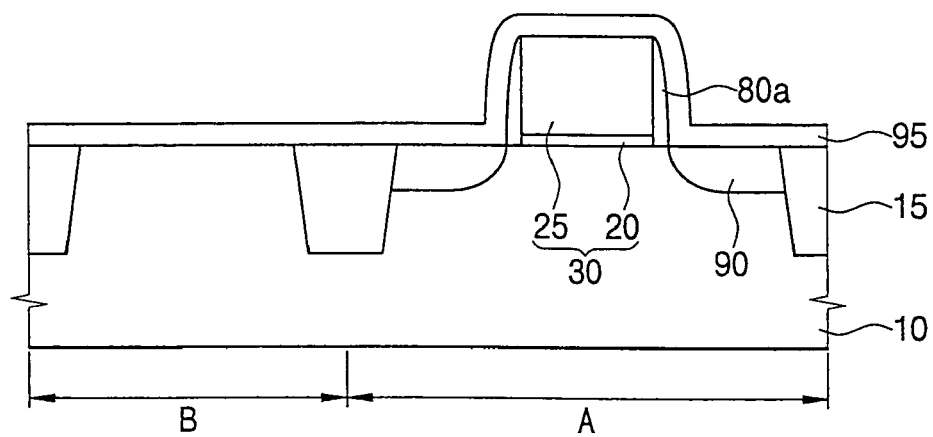

Referring to FIG. 2D, a silicide blocking layer 95 is formed on substrate 10 including lightly doped source/drain region 90. Silicide blocking layer 95 is preferably a silicon nitride layer, silicon oxide layer, or a composition layer thereof, and has a thickness of about 1 Å to about 1500 Å.

Figure 2E:
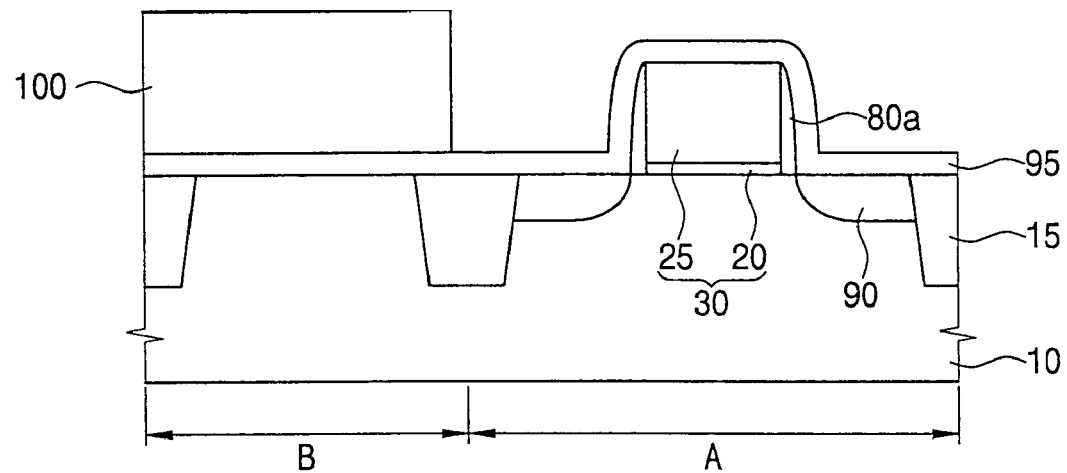

Referring to FIG. 2E, a photoresist film (not shown) is coated on silicide blocking layer 95, and is partially removed by an exposing and developing processes to form a photoresist pattern 100.

Figure 2F:
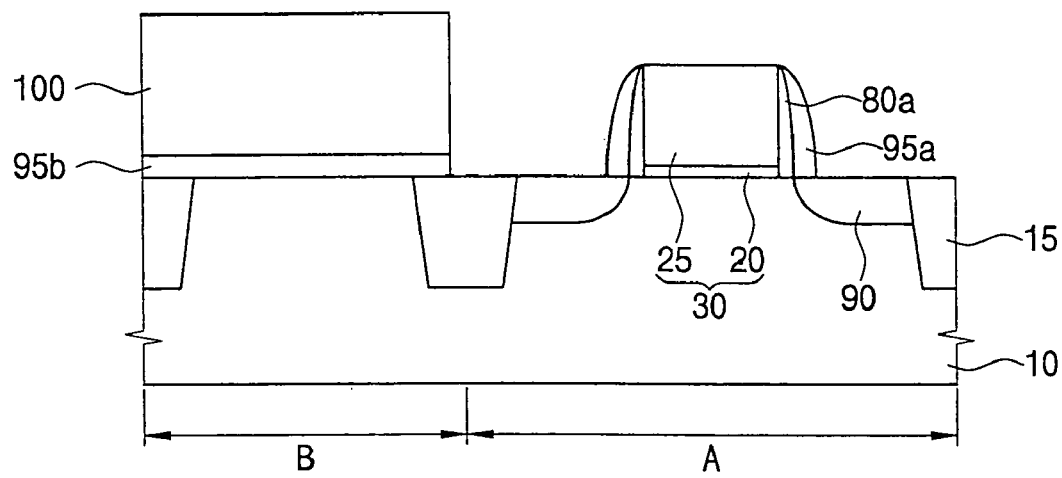

Referring to FIG. 2F, silicide blocking layer 95 is partially etched away using photoresist pattern 100 as an etching mask. As a result, a gate spacer 95a is formed on sidewalls of offset spacer 80a, and a silicide blocking layer pattern 95b is formed on resistor region B.

Figure 2G:
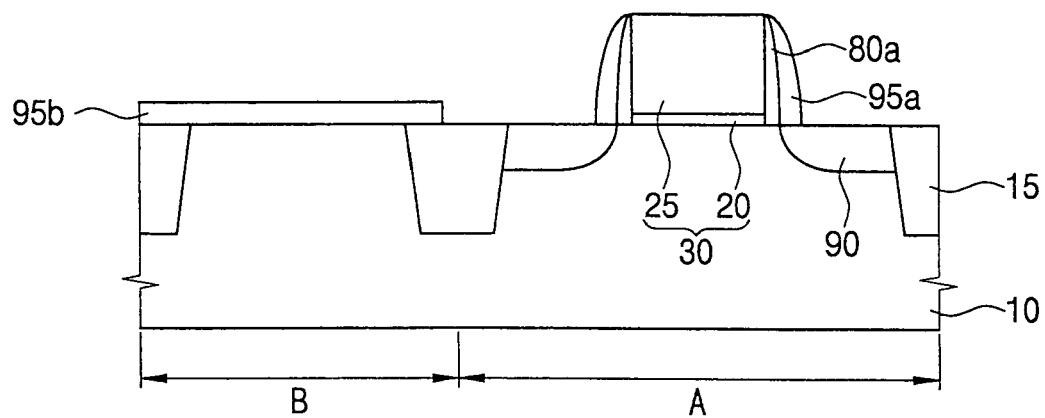

Referring to FIG. 2G, photoresist pattern 100 is removed. Accordingly, gate spacer 95a remains on the sidewalls of offset spacer 80a. In addition, silicide blocking layer pattern 95b also remains on resistor region B to prevent a silicide layer from being coated on resistor region B in a later process step.

Figure 2H:
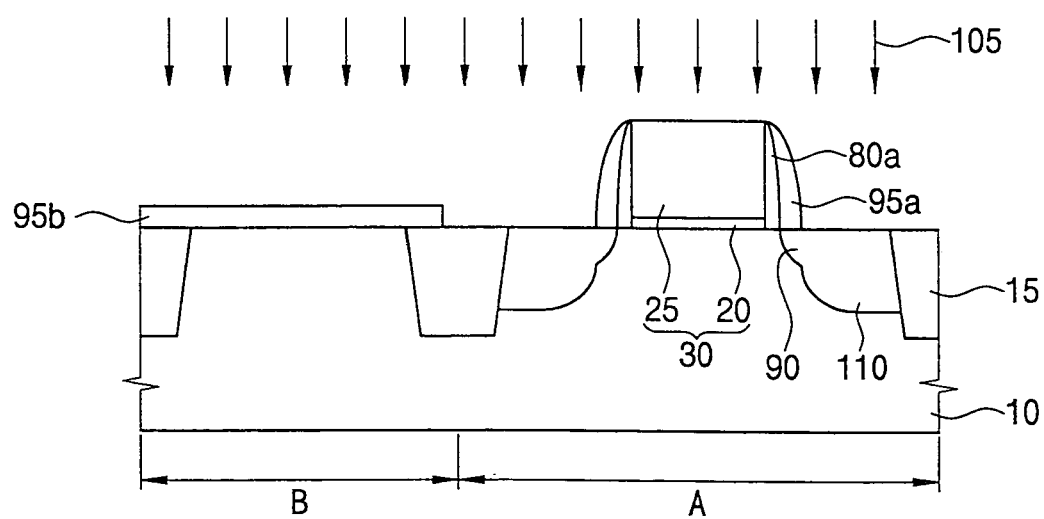
Figure 21:
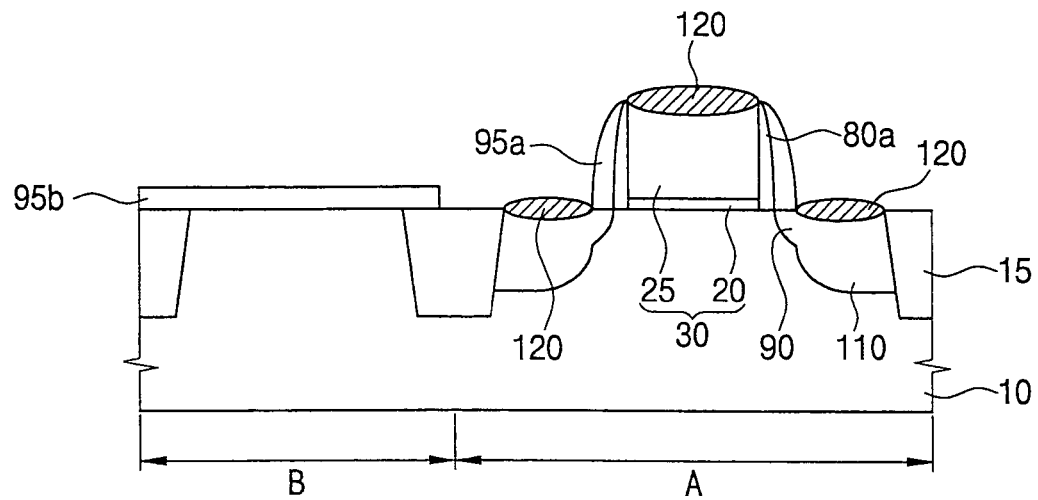

Referring to FIG. 2H, second dopants 105 are heavily implanted into substrate 10 using silicide blocking layer pattern 95b, gate electrode 30, offset spacer 80a, and gate spacer 95a as another implant mask to form a heavily doped source/drain region 110.

Referring to FIG. 2I, a silicide layer 120 is formed on gate electrode 30 and heavily doped source/drain region 110. In the present embodiment, a metal layer (not shown), preferably of titanium (Ti), cobalt (Co), iron (Fe), and nickel (Ni), having a high melting point is formed on substrate 10. A heat treatment is performed on substrate 10 and metal layer to generate a silicidation reaction between the metal layer and silicon on the surface of substrate 10 and heavily doped source/drain region 110. Any remaining metal layer on substrate 10 after the silicidation reaction is removed. Accordingly, silicide layer 120 is formed on gate electrode 30 and heavily doped source/drain region 110.

According to an embodiment of the present invention, the silicide blocking layer and the offset spacer are formed prior to the formation of a lightly doped source/drain region; therefore, a lateral diffusion of dopants in the lightly doped source/drain region is reduced, and the short channel effect is thereby reduced. The STI junction leakage caused by dopants in the heavily doped source/drain region is also reduced. Furthermore, since the silicide blocking layer and the offset spacer or the gate spacer are formed in the same process, the manufacturing process is simplified, thereby improving the productivity of the semiconductor device.

Although the exemplary embodiments of the present invention have been described, it is understood that the present invention should not be limited to these exemplary embodiments but various changes and modifications can be made by one skilled in the art within the scope of the present invention.

What is claimed is:

1. A method for manufacturing a semiconductor device, comprising:
   forming a gate electrode on a first region of a semiconductor substrate;
   forming a silicide blocking layer on the substrate and the gate electrode;
   partially removing the silicide blocking layer to form a first gate spacer on sidewalls of the gate electrode on the first region and a silicide blocking layer pattern on a second region;
   implanting dopants lightly into the substrate using the silicide blocking layer, the gate electrode, and the first gate spacer as a first implantation mask to form a lightly doped source/drain region on the first region;
   forming a second gate spacer on sidewalls of the first gate spacer;
   implanting dopants heavily into the substrate using the silicide blocking layer, the gate electrode, the first gate spacer, and the second gate spacer as a second implantation mask to form a heavily doped source/drain region on the first region; and
   forming a silicide layer on the gate electrode and the heavily doped source/drain region in the first region.

2. The method of claim 1, wherein the silicide blocking layer is a silicon nitride layer, silicon oxide layer, or a composition layer thereof.

3. The method of claim 1, wherein the silicide blocking layer has a thickness of about 1 Å to about 1500 Å.

4. The method of claim 1, wherein forming the gate electrode comprises:
   sequentially forming a gate insulation layer and a polysilicon layer on the substrate; and
   partially removing the gate insulation layer and the polysilicon layer, thereby forming a gate insulation layer pattern and a polysilicon layer pattern, respectively.

5. The method of claim 1, wherein forming the silicide layer comprises:
   forming a metal layer on the substrate and the heavily doped source/drain region;
   performing a heat treatment on the metal layer to cause a silicidation reaction between the metal layer and silicon on the surface of the substrate and the heavily doped source/drain region; and
   removing un-reacted metal layers on the substrate after the silicidation reaction.

6. The method of claim 5, wherein the metal layer is formed from a metal selected from a group consisting of titanium (Ti), cobalt (Co), iron (Fe), and nickel (Ni).

7. The method of claim 1, wherein the forming the second gate spacer comprises:
   forming an insulating layer on the substrate, the gate electrode including the first gate spacer, and the silicide blocking layer pattern; and
   partially removing the insulating layer to form the second gate electrode.

8. A method for manufacturing a semiconductor device, comprising:
   forming a gate electrode in a transistor region of a semiconductor substrate, the substrate being divided into the transistor region and a resistor region;
   forming a silicide blocking layer on the substrate and the gate electrode;
   partially removing the silicide blocking layer such that a first gate spacer is formed on sidewalls of the gate electrode on the transistor region and a silicide blocking layer formed on the resistor region;
   implanting dopants lightly into the surface of the substrate using the silicide blocking layer, the gate electrode, and the first gate spacer as a first implantation mask to form a lightly doped source/drain region on the surface of the transistor region;
   forming a second gate spacer on sidewalls of the first gate spacer;
   implanting dopants heavily into the surface of the substrate using the silicide blocking layer, the gate electrode, the first gate spacer, and the second gate spacer as a second implantation mask to form a heavily doped source/drain region on the surface of the transistor region; and
   forming a silicide layer on the gate electrode and the heavily doped source/drain region in the transistor region.

9. The method of claim 8, wherein the silicide blocking layer is a silicon nitride layer, silicon oxide layer, or a composition layer thereof.

10. The method of claim 8, wherein the silicide blocking layer has a thickness of about 1 Å to about 1500 Å.

11. The method of claim 8, wherein forming the gate electrode includes:
sequentially forming a gate insulation layer and a polysilicon layer on the substrate after forming the gate electrode; and
partially removing the gate insulation layer and the polysilicon layer to form a gate insulation layer pattern and a polysilicon layer pattern, respectively.

12. The method of claim 8, wherein forming the silicide layer includes:
forming a metal layer on the substrate and the heavily doped source/drain region;
performing a heat treatment on the metal layer to cause a silicidation reaction between the metal layer and silicon on the surface of the substrate and the heavily doped source/drain region; and
removing un-reacted metal layers on the substrate after the silicidation reaction.

13. The method of claim 12, wherein the metal layer is formed from a metal selected from a group consisting of titanium (Ti), cobalt (Co), iron (Fe), and nickel (Ni).

14. The method of claim 8, wherein the forming the second gate spacer comprises:
forming an insulating layer on the substrate, the gate electrode including the first gate spacer, and the silicide blocking layer pattern; and
partially removing the insulating layer to form the second gate electrode.

15. A method of manufacturing a semiconductor device, comprising:
forming a gate electrode in a transistor region of a semiconductor substrate, the substrate being divided into the transistor region and a resistor region;
forming a first gate spacer on sidewalls of the gate electrode;
implanting dopants lightly into the surface of the substrate using the gate electrode and the first gate spacer as a first implantation mask to form a lightly doped source/drain region;
forming a silicide blocking layer on the substrate and the lightly doped source/drain region;
partially removing the silicidation blocking layer such that a second gate spacer is formed on sidewalls of the first gate spacer in the transistor region and a silicide blocking layer pattern is formed in the resistor region;
implanting dopants heavily into the surface of the substrate using the silicide blocking layer, the gate electrode, the first gate spacer, and the second gate spacer as a second implantation mask to form a heavily doped source/drain region on the surface of the transistor region; and
forming a silicide layer on the gate electrode and the heavily doped source/drain region in the transistor region.

16. The method of claim 15, wherein the silicide blocking layer is a silicon nitride layer, silicon oxide layer, or a composition layer thereof.

17. The method of claim 15, wherein the silicidation blocking layer has a thickness of about 1 Å to about 1500 Å.

18. The method of claim 15, wherein forming the gate electrode includes:
sequentially forming a gate insulation layer and a polysilicon layer on the substrate after forming the gate electrode; and
partially removing the gate insulation layer and the polysilicon layer to form a gate insulation layer pattern and a polysilicon layer pattern.

19. The method of claim 15, wherein forming the silicide layer includes:
forming a metal layer on the substrate and the heavily doped source/drain region;
performing a heat treatment on the metal layer to cause a silicidation reaction between the metal layer and silicon on the surface of the substrate and the heavily doped source/drain region; and
removing a un-reacted metal layers on the substrate after the silicidation reaction.

20. The method of claim 19, wherein the metal is selected from the group consisting of titanium (Ti), cobalt (Co), iron (Fe), and nickel (Ni).

* * * * *